(12) United States Patent
Lee et al.

(10) Patent No.: US 9,446,569 B2
(45) Date of Patent: Sep. 20, 2016

(54) METHOD FOR MANUFACTURING DISPLAY DEVICE

(71) Applicants: Samsung Display Co., Ltd., Yongin (KR); YODOGAWA MEDEC CO., LTD., Osaka OT (JP)

(72) Inventors: Kyung-Su Lee, Yongin (KR); Jong-Hwan Kim, Yongin (KR); Young-Sik Kim, Yongin (KR); Yang-Han Son, Yongin (KR); Shigeru Kimura, Osaka (JP)

(73) Assignees: Samsung Display Co., Ltd. (KR); YODOGAWA MEDEC CO., LTD (JP)

( * ) Notice: Subject to any disclaimer, the term of this patent is extended or adjusted under 35 U.S.C. 154(b) by 161 days.

(21) Appl. No.: 14/283,725

(22) Filed: May 21, 2014

(65) Prior Publication Data

US 2014/0345792 A1   Nov. 27, 2014

(30) Foreign Application Priority Data

May 27, 2013   (KR) .......................... 10-2013-0059788

(51) Int. Cl.
| | |
|---|---|
| *B32B 38/18* | (2006.01) |
| *H01L 51/52* | (2006.01) |
| *B32B 37/00* | (2006.01) |
| *B29C 65/00* | (2006.01) |
| *B32B 37/12* | (2006.01) |
| *G02F 1/1333* | (2006.01) |

(52) U.S. Cl.
CPC ......... *B32B 37/0046* (2013.01); *B29C 66/345* (2013.01); *B32B 38/1866* (2013.01); *B32B 2037/1253* (2013.01); *B32B 2457/202* (2013.01); *B32B 2457/206* (2013.01); *G02F 2001/133331* (2013.01); *H01L 51/524* (2013.01); *H01L 51/5246* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2014/0002975 A1* | 1/2014 | Lee ...................... | H05K 5/0017 361/679.01 |
| 2014/0345791 A1* | 11/2014 | Son ...................... | B32B 37/0046 156/228 |

FOREIGN PATENT DOCUMENTS

| | | |
|---|---|---|
| KR | 10-2012-0088025 A | 8/2012 |
| KR | 10-2012-0124807 A | 11/2012 |

* cited by examiner

*Primary Examiner* — Barbara J Musser
(74) *Attorney, Agent, or Firm* — Innovation Counsel LLP

(57) ABSTRACT

A window bonding apparatus is provided. The window bonding apparatus includes a resilient display panel supporter supporting a flexible display panel thereon, a holding member supporting and squeezing inwardly opposed ends of the display panel supporter so as to attain a desired degree of curvature, a first jig disposed under the display panel supporter and having a rigid first face with which the bottom face of the display panel supporter comes into contact when pressed from above, and a second jig disposed above the display panel supporter and having a second face to which the window is releaseably attached, the second jig being movable toward the display panel, wherein the second jig is moved to the first jig to attach the window to the display panel in a manner which progressively increases contact area between the window and the display panel.

5 Claims, 5 Drawing Sheets

METHOD FOR MANUFACTURING DISPLAY DEVICE

CROSS-REFERENCE TO RELATED APPLICATION

This application claims priority to and the benefit of Korean Patent Application No. 10-2013-0059788 filed in the Korean Intellectual Property Office on May 27, 2013, the entire contents of which application are incorporated herein by reference.

BACKGROUND (a) Field of Disclosure

The present disclosure relates to a window bonding device and to a method for manufacturing a display device using the same.

(b) Description of Related Technology

A variety of thin panel display technologies such organic light emitting diode (OLED) displays, liquid crystal displays (LCDs), etc. can be used as monitors for computers, as portable terminals and as image displaying apparatuses for various other information providing (and/or inputting) devices.

These thin panel display devices typically include a thin and bendable display panel configured for displaying an image and a more rigid, more hard window provided in front of (or on top of in the case of the drawings provided herein) the display panel for protecting the more delicate surface of the display panel. In other words, the protective window is attached to the major surface of the display panel from which the displayed image is projected. To attach the window to the display panel, a liquid adhesive layer is typically coated onto the display panel, and then the window and the display panel are bonded to each other under normal pressure and the adhesive layer is cured (solidified).

In the case of relatively rigid and flat panel displays, because one flat object (e.g., the window) is being mated with a perfectly matched other object (e.g., the display panel), bubbles are generally not formed in the liquid adhesive layer and a problem of poor bonding due to bubbles therefore does not occur when the flat window is attached to the flat display panel while using an adhesive layer and under the normal bonding pressures.

On the other hand, in the case of flexible display panels, however, the problems of bubble creation and poor bonding, as well as poor alignment between the display panel and the window tend to occur more often. It would be advantageous to have a system and method for avoiding or reducing the frequency of such problems.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

A method in accordance with the present disclosure of invention provides a progressively increasing area of contact between a resiliently supported and flexible display panel and a protective and to-be-bonded therewith window. The method has the advantages of improving quality of a bonding face between the flexible display panel and the window when the flexible display panel and the window are bonded to each other.

A window bonding apparatus in accordance with the disclosure includes: a display panel supporter configured to resiliently support thereon a less stiff and flexible display panel; a holding member configured to squeeze the display panel supporter into an arched state; a first jig disposed under the display panel supporter and having a rigid first face with which the bottom face of the resilient display panel supporter can come into conforming contact with; and a second jig disposed above the display panel and having a second face onto which the window is releaseably attached, the second jig being movable toward the display panel, wherein the second jig is moved toward the first jig so as to progressively increase contact area between the window and the display panel and thus attach the display panel conformably to the window without forming bubbles in an adhesive coating provided between the window and the display panel.

The display panel supporter may have a plate shape.

The display panel supporter may include a convex part bent upward.

The width of the display panel supporter may be greater than the width of the first jig.

The holding member may be movable in a direction perpendicular to the direction in which the second jig is moved.

The holding member may include a recess into which and end of the display panel supporter is inserted.

The holding member may include a clamp.

A pair of holding member elements respectively disposed at opposed ends of the display panel supporter may be provided.

The holding member may be located at both sides of the first jig.

The both ends of the first and second faces may be curved. The centers of the first and second faces may be flat.

The first face and the second face may be matched with each other.

The window bonding apparatus according to an exemplary embodiment can bond a protective window to a flexible display panel such that the bonding interface is substantially free of bubbles and good alignment between the display panel and the window is achieved.

DETAILED DESCRIPTION

Figure 1:
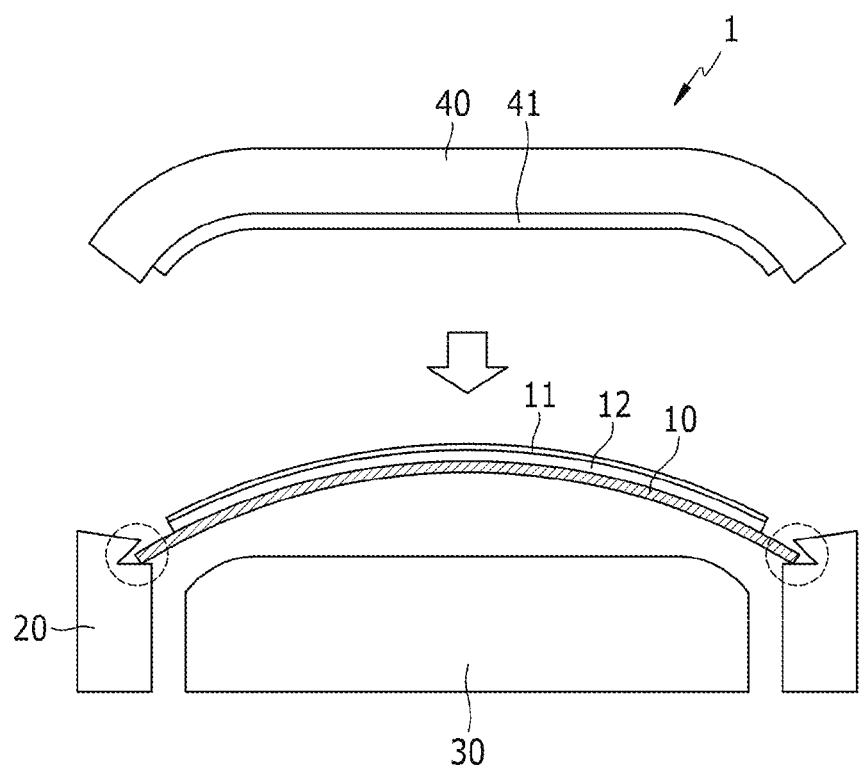
FIG. 1 is a side sectional view illustrating a window bonding apparatus loaded with a to-be-bonded window and a corresponding display panel in accordance with an exemplary embodiment.

The present disclosure of invention will be described more fully hereinafter with reference to the accompanying drawings, in which exemplary embodiments are shown. As those skilled in the art would realize after appreciating the present teachings, the described embodiments may be modified in various different ways, all without departing from the spirit or scope of the present teachings.

The drawings and description are to be regarded as illustrative in nature and not restrictive. Like reference numerals designate like elements throughout the specification.

In the drawings, dimensions and thicknesses of components are exaggerated, omitted or schematically illustrated for clarity and convenience of description. In addition, dimensions of constituent elements do not entirely reflect actual dimensions thereof.

In the drawings, the thickness of layers, films, panels, regions, etc., are exaggerated for clarity. In addition, thicknesses of some layers and areas are exaggerated for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not to the exclusion of any other elements. Furthermore, the expression "on" or "under" may be used herein to represent the relationship of one element to another element as illustrated in the figures. It will be understood that this expression is intended to encompass different orientations of the elements in addition to the orientation depicted in the figures, namely, to encompass both "on" and "under".

A description will be given of a window bonding apparatus according to an exemplary embodiment with reference to the attached drawings.

FIG. 1 illustrates a window bonding apparatus according to an exemplary embodiment.

Referring to FIG. 1, a window bonding apparatus 1 according to an exemplary embodiment may include a display panel supporter 10, a holding member 20, a first jig 30 and a second jig 40.

The display panel supporter 10 is a resilient component for supporting a laid there upon flexible display panel 11 and may be formed in a rectangular shape.

More specifically, the display panel 11 is formed of a flexible material and the display panel supporter 10 for supporting the display panel 11 is preferably also made of a flexible, albeit more form retaining material such as a resilient or spring like material that can be resiliently bent into an arched shape as shown in FIG. 1. At least the top surface of the display panel supporter 10 is smooth and of low friction relative to the material of the flexible display panel 11. (Also, at least outer ends of the bottom surface of the display panel supporter 10 are smooth and of low friction relative to the material of the lower jig 30 because they slide on the lower jig 30 as shall be seen in FIG. 2.)

The flexible display panel 11 is laid onto the arched display panel supporter 10 so as to have the same surface shape and curvature as that of the resilient supporter 10 whereby, when the display panel 11 is laid out (e.g., rolled out) on top of the smooth surfaced supporter 10, the display panel 11 relaxes into full contact with the top of the display panel supporter 10.

While FIG. 1 shows that the display panel supporter 10 is configured in the form of a plate, the present disclosure of invention is not limited thereto.

Referring to FIG. 1, a protection film 12 may be interposed between the display panel 11 and the display panel supporter 10 to protect the one side of the display panel 11 that is disposed in otherwise direct contact with the display panel supporter 10.

In the present exemplary embodiment, the width of the display panel supporter 10 is greater than the width of the display panel 11.

The to-be-bonded window 41 is retained in an upper and larger-than-the-window second jig 40 while he display panel 11 is similarly retained on top of and in the middle of the larger-than-the-window (and also larger-than-the-display panel) upper surface of the supporter 10. The more outward ends of the display panel supporter 10 are held by the holding member 20 which will be described later. Because of the difference in size between the larger surface of the supporter 10 and the smaller surfaces of the to-be-bonded window 41 and panel 11, the ends of the display panel supporter 10 are spaced apart to extend beyond the corresponding ends of the display panel 11 by a predetermined distance. As a consequence, the full overall surface of the display panel 11 including the ends thereof can be uniformly bonded to the corresponding and counterpart surface of the window 41.

In the illustrated exemplary embodiment, the display panel supporter 10 is resiliently bent into a convex form such that the window 41 can be slowly lowered down and attached in a progressive surface contacting manner to the display panel 11 starting from the apex of the convex part of the display panel supporter 10 and progressively working outwardly to both opposed ends of the display panel supporter 10. As this occurs, air between the to-be-bonded window 41 and the display panel 11 is expelled through a channel formed between the not yet-contacting surface portions of these components. The top surface of the display panel 11 is understood to have been pre-coated with a uniform layer of a liquid adhesive.

The process of bonding the display panel 11 and the window 41 to each other will be described in more detail with reference to FIGS. 2 and 3. The holding member 20 includes holding posts disposed at the opposed ends of the display panel supporter 10.

As shown in FIG. 1, the holding member 20 is a component for supporting the ends of the display panel supporter 10 and causing the supporter 10 to take on the illustrated bent shape.

To support the opposed edges of the display panel supporter 10, the holding member 20 may include respective recesses (e.g., grooves) formed at opposed sides thereof such that the respective edges of the display panel supporter 10 can be inserted into the corresponding recesses, as shown in FIG. 1. Alternatively, the holding member 20 may be configured to include one or more clamps for fixing respective ends of the arched display panel supporter 10.

As described above, the display panel supporter 10 is resilient and it can be bent or unbent to thereby attain a desired degree of curvature along its top face. At least one of the opposed posts of the holding member 20 may be inwardly and outwardly movable for thereby adjustably pressing on the resilient display panel supporter 10 and causing it to attain the desired degree of curvature.

In one embodiment, the display panel 11 is supplied into the bonding apparatus in a conveyor belt style. Here, the holding member 20 supporting or fixing the ends of the display panel supporter 10 is made to move in tandem with the display panel supporter 10 and the display panel 11 supported thereon according to a supplying movement of the display panel 11.

To achieve this, the holding member 20 may include a moving means (not shown) such as a rail such that the holding member 20 can be moved forward and back relative to the plane of the drawing. Additionally, because the display panel 11 needs to be aligned relative to the overhanging window 41 before they are mated, the holding member 20 may include a further moving means (not shown) to move the combination of the supporter 10 and supported panel 11 to the left and to right in FIG. 1. Moreover, because the curvature of the bent supporter 10 may need to be adjusted by bending it more or unbending it slightly, at least one of the opposed posts of the holding member 20 may be made movable relative to the other post in the left to right directions in the present exemplary embodiment.

When a pair of holding member posts (20) respectively disposed at both ends of the display panel supporter 10 are provided, the holding member posts may be configured in such a manner that one of the holding member posts 20 is movable and the other is fixed or both are movable.

The lower, or first, jig 30 is disposed under and initially spaced apart from the display panel supporter 10.

The upper, or second, jig 40 is configured to be lowered straight down (vertically) into engagement with the first, jig 30. When the top side of the display panel supporter 10 is pressed down by the second jig 40 which will be described in more detail later, the bottom face of the display panel supporter 10 comes into contact with the rigid shape of the first jig 30 and then the shape of the flexible display panel supporter 10 to support the display panel supporter 10 and the shape of the flexible display panel 11 conform to the shape of the rigid first jig 30.

Referring to FIG. 1, the center of the top face of the first jig 30 is flat and both ends thereof are downwardly curved. Here, a degree to which the top face of the first jig 30 is flat and a degree to which the top face of the first jig 30 is bent may depend on a degree to which the display panel 11 needs to be bent so as to conform with the inner surface (bottom surface in the drawings) of the to-be-bonded window 41.

The second jig 40 is disposed above the display panel supporter 10.

Upon alignment of the window 41 under the second jig 40, the second jig 40 is moved downward toward the display panel 11, that is, moved vertically downward in FIG. 1 to press the window 41 against the top face of the resiliently supported display panel 11 (resiliently supported by supporter 10).

More specifically, the second jig 40 can be moved toward the display panel 11, that is, moved downward in FIG. 1 to press the top face of the display panel 11 and attach the window 41 to the display panel 11 along with pressing both down onto the first jig 30.

Referring to FIG. 1, the shape of the bottom face of the second jig 40 corresponds to the shape of the top face of the first jig 30.

A description will now be given of a process of lowering the second jig 40 to bond the display panel 11 and the window 41 to each other with reference to FIGS. 2 and 3.

Figure 2:
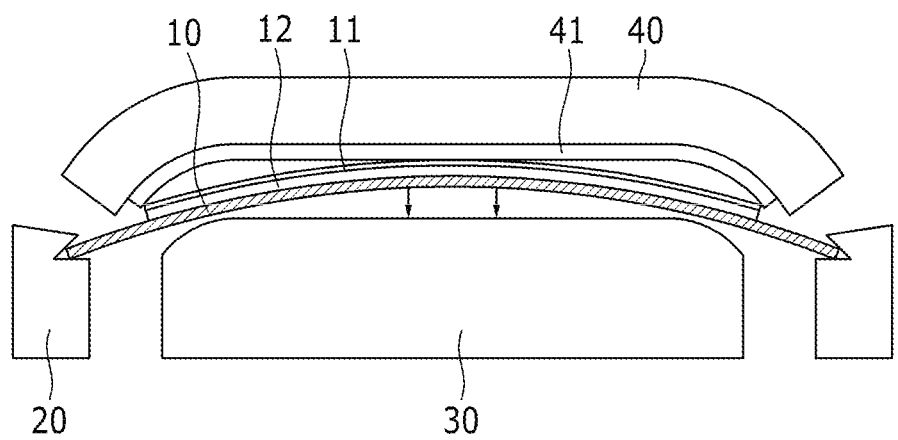
FIG. 2 illustrates a lowering of an upper (second) jig onto a flexibly supported display panel in accordance with an exemplary embodiment.

FIG. 2 illustrates an initial engagement point in the lowering of the second jig 40 toward the first jig 30. FIG. 3 illustrates the completion of the lowering and a subsequent bonding of the window 41 to the fully contacted display panel 11 according to an exemplary embodiment.

Referring to FIG. 2, the second jig 40 on which the window 41 is disposed is lowered toward the display panel 11 disposed on the display panel supporter 10.

Since the display panel 11 and the display panel supporter 10 are bent in a convex form, the window 41 first comes into contact with the apex portion of the then-convex surface of the display panel 11.

Figure 3:
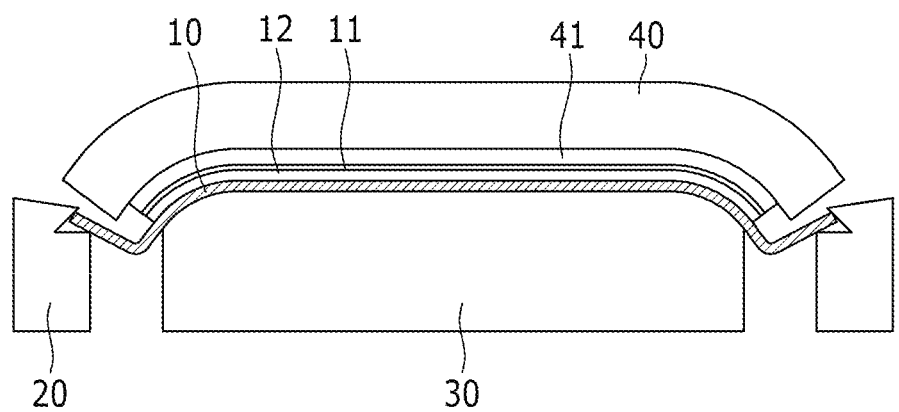
FIG. 3 illustrates completion of the bonding of the window to the display panel of FIG. 2 in accordance with the exemplary embodiment.

Referring to FIG. 3, as the second jig 40 is progressively further lowered, the area of contact between the to-be-bonded window 41 and the display panel 11 progressively expands from the middle and towards the left and right ends. At the same time, as the display panel 11 and the display panel supporter 10 are progressively pressed downwardly by the second jig 40, the bottom face of the display panel supporter 10 progressively comes into increasing contact with the first jig 30. As mentioned, the top surface of the display panel 11 is understood to have been pre-coated with a uniform layer of a liquid adhesive.

The top face of the display panel 11 is removably affixed into contact with the bottom surface of the second jig 40. This may be achieved by vacuum pressure and/or other means (e.g., electrostatic attraction).

Here, the holding member 20 moves in a direction perpendicular to the direction in which the second jig 40 is moved, that is, in the lateral direction in FIG. 3 to support both ends of the display panel supporter 10 even when both ends of the flexible display panel supporter 10 are pushed out in the lateral direction while the second jig 40 moves down toward contact with the first jig 30.

Upon completion of movement of the second jig 40 toward the first jig 30, the window 41 comes into complete contact with the whole of the adhesive coated surface of the display panel 11, and thus the process of bonding the window 41 to the display panel 11 can be ended. (Although FIG. 3 schematically shows the outer ends of the window 41 as being flush with the outer ends of the display panel 11, in general the outer ends of the window 41 will extend outwardly beyond the outer ends of the display panel 11.)

As described above, the first jig 30 and the second jig 40 are matched with each other. Embodiments and modifications of the first and second jigs 30 and 40 will now be described.

Figure 4:
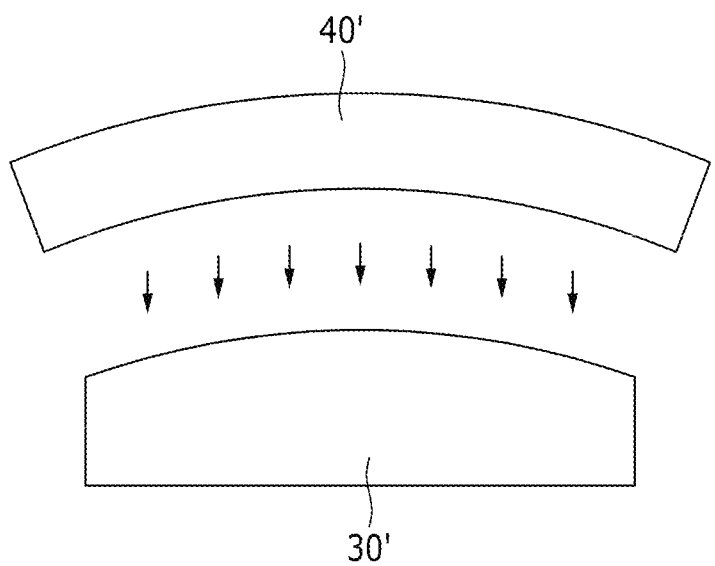
FIG. 4 illustrates a first jig and a second jig according to another exemplary embodiment.
Figure 5:
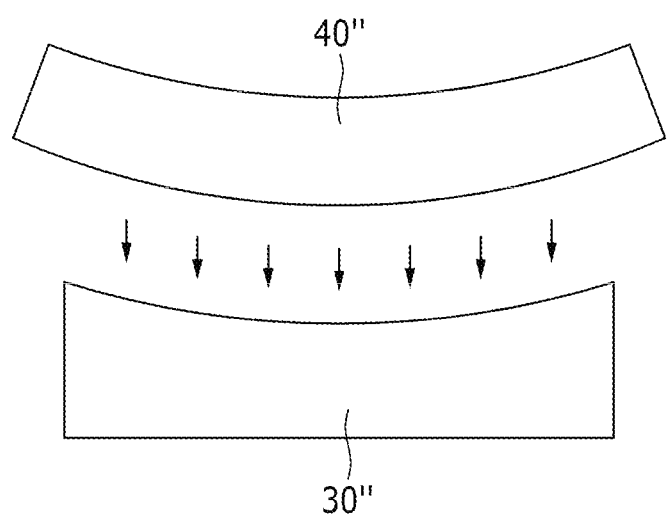
FIG. 5 illustrates a first jig and a second jig according to yet another exemplary embodiment.

FIG. 4 illustrates the first jig and the second jig according to another exemplary embodiment. FIG. 5 illustrates the first jig and the second jig according to yet another exemplary embodiment.

Referring to FIGS. 4 and 5, the top face of the first jig 30 and the bottom face of the second jig 40 may have curved surfaces.

More specifically, referring to FIG. 4, the top face of the first jig 30' is formed in a convex form and the bottom face of the second jig 40' is formed in a substantially matching concave form such that the bottom face of the second jig 40' corresponds to the top face of the first jig 30'.

Referring to FIG. 5, the top face of the first jig 30" is formed in a concave form and the bottom face of the second jig 40" is formed in a substantially matching convex form such that the top face of the first jig 30" corresponds to the bottom face of the second jig 40"

According to the above-mentioned configuration, the window bonding apparatus 1 according to an exemplary embodiment obtains a uniform bonding face between the display panel 11 and the window 41 when the window 41 is attached to the display panel 11, prevents bubbles from being generated in the adhesive layer and achieves alignment between the display panel 11 and the window 41.

While this disclosure of invention has been described in connection with what is presently considered to be practical exemplary embodiments, it is to be understood that the present teachings are not limited to the disclosed embodiments, but, on the contrary, are intended to cover various modifications and equivalent arrangements included within the spirit and scope of the present teachings.

What is claimed is:

1. A method of bonding a supplied window to a correspondingly supplied and flexible display panel for protectively covering the flexible display panel, the method comprising:
    disposing the flexible display panel on a stiffer display panel supporter that is configured to resiliently support the flexible display panel thereon, the display panel supporter being formed of a resiliently bendable material;
    retaining and squeezing opposed ends of the display panel supporter in a manner which allows the display panel supporter to flex between an arched state and a more flattened state;
    providing a first jig disposed under the display panel supporter and having a rigid first face with which a bottom face of the display panel supporter can be resiliently brought into conforming contact with;
    providing a second jig disposed above the display panel supporter and having a second face onto which the supplied window is releaseably attached, the second jig being movable toward the display panel supporter and the underlying first jig; and
    moving the second jig toward the first jig so as to press the window into progressively increasing contact with the display panel.

2. The method of claim 1 and further comprising:
    coating a top surface of the flexible display panel with a curable liquid adhesive.

3. The method of claim 2 and further comprising:
    after the second jig has pressed the window into contact with the whole of the adhesive coated surface of the display panel, curing the adhesive.

4. The method of claim 1 and further comprising:
    moving the squeezed display panel supporter so as to bring a center of its maximally arched state into alignment with a corresponding portion of the second jig.

5. The method of claim 1 and further comprising:
    adjusting the squeezing applied to the display panel supporter so as to cause the display panel supporter to have a predetermined degree of curvature at least at a center area of its maximally arched state.

* * * * *

UNITED STATES PATENT AND TRADEMARK OFFICE
CERTIFICATE OF CORRECTION

PATENT NO. : 9,446,569 B2  
APPLICATION NO. : 14/283725  
DATED : September 20, 2016  
INVENTOR(S) : Lee et al.

Page 1 of 1

It is certified that error appears in the above-identified patent and that said Letters Patent is hereby corrected as shown below:

On the Title Page

(72) Inventors, please add:  
Kwan Young Han Seongnam-si, (KR)

Signed and Sealed this  
Twenty-fourth Day of September, 2019

Andrei Iancu  
*Director of the United States Patent and Trademark Office*